United States Patent
Chu

(10) Patent No.: US 11,588,422 B2
(45) Date of Patent: Feb. 21, 2023

(54) SOFT-START CIRCUIT

(71) Applicant: Global Mixed-mode Technology Inc., Hsin-Chu (TW)

(72) Inventor: Chien-Lun Chu, Hsinchu County (TW)

(73) Assignee: Global Mixed-mode Technology Inc., Hsin-Chu (TW)

(*) Notice: Subject to any disclaimer, the term of this patent is extended or adjusted under 35 U.S.C. 154(b) by 358 days.

(21) Appl. No.: 17/003,976

(22) Filed: Aug. 26, 2020

(65) Prior Publication Data
US 2022/0069742 A1 Mar. 3, 2022

(51) Int. Cl.
*H02P 1/04* (2006.01)
*H03K 7/08* (2006.01)
*H02P 1/18* (2006.01)
*H02P 6/20* (2016.01)

(52) U.S. Cl.
CPC .............. *H02P 1/04* (2013.01); *H02P 1/18* (2013.01); *H03K 7/08* (2013.01); *H02P 6/20* (2013.01)

(58) Field of Classification Search
CPC ..... H02P 1/04; H02P 1/18; H02P 6/20; H03K 7/08; H03K 3/013

USPC .................................. 318/430, 599, 560
See application file for complete search history.

(56) References Cited

U.S. PATENT DOCUMENTS

| | | | |
|---|---|---|---|
| 6,016,042 A * | 1/2000 | Miura | H02P 7/04 318/434 |
| 7,315,160 B2 | 1/2008 | Fosler | |
| 7,915,843 B2 * | 3/2011 | Mishima | H02P 6/26 318/400.04 |
| 8,310,184 B2 * | 11/2012 | Takeuchi | H02P 6/28 318/599 |
| 8,853,980 B2 | 10/2014 | Chang | |
| 9,825,562 B2 * | 11/2017 | Suzuki | H02P 6/06 |

FOREIGN PATENT DOCUMENTS

| | | |
|---|---|---|
| CN | 103036484 A | 4/2013 |
| JP | 4771032 | 7/2011 |
| TW | M523252 U | 6/2016 |
| TW | M536372 U | 2/2017 |

* cited by examiner

*Primary Examiner* — David Luo
(74) *Attorney, Agent, or Firm* — Winston Hsu

(57) ABSTRACT

A soft-start circuit which can be applied to a motor controller is provided. The soft-start circuit comprises a controller, a counting unit, a digital-to-analog converter, a current detecting unit, and a comparator. The soft-start circuit uses a plurality of current limit values so as to achieve a maximum output power and prevent damage to a motor coil.

16 Claims, 2 Drawing Sheets

SOFT-START CIRCUIT

BACKGROUND OF THE INVENTION

1. Field of the Invention

The present invention relates to a soft-start circuit, and more particularly, to a soft-start circuit which can be applied to a motor controller.

2. Description of the Prior Art

Conventionally, a motor controller is configured to drive a motor coil based on a pulse width modulation signal. When the system starts to supply the power to the motor controller, the pulse width modulation signal has an initial duty ratio. The duty ratio is increased gradually as the time increases, so as to control the current flowing through the motor coil and prevent damage to the motor coil due to the large initial current. However, such method cannot make sure that if the current flowing through the motor coil exceeds a current limit value. Thus, the optimum output power cannot be achieved.

SUMMARY OF THE INVENTION

According to the present invention, a soft-start circuit which can be applied to a motor controller is provided. The soft-start circuit comprises a controller, a counting unit, a digital-to-analog converter, a current detecting unit, and a comparator. The soft-start circuit uses a plurality of current limit values so as to achieve a maximum output power and prevent damage to a motor coil.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION

Figure 1:
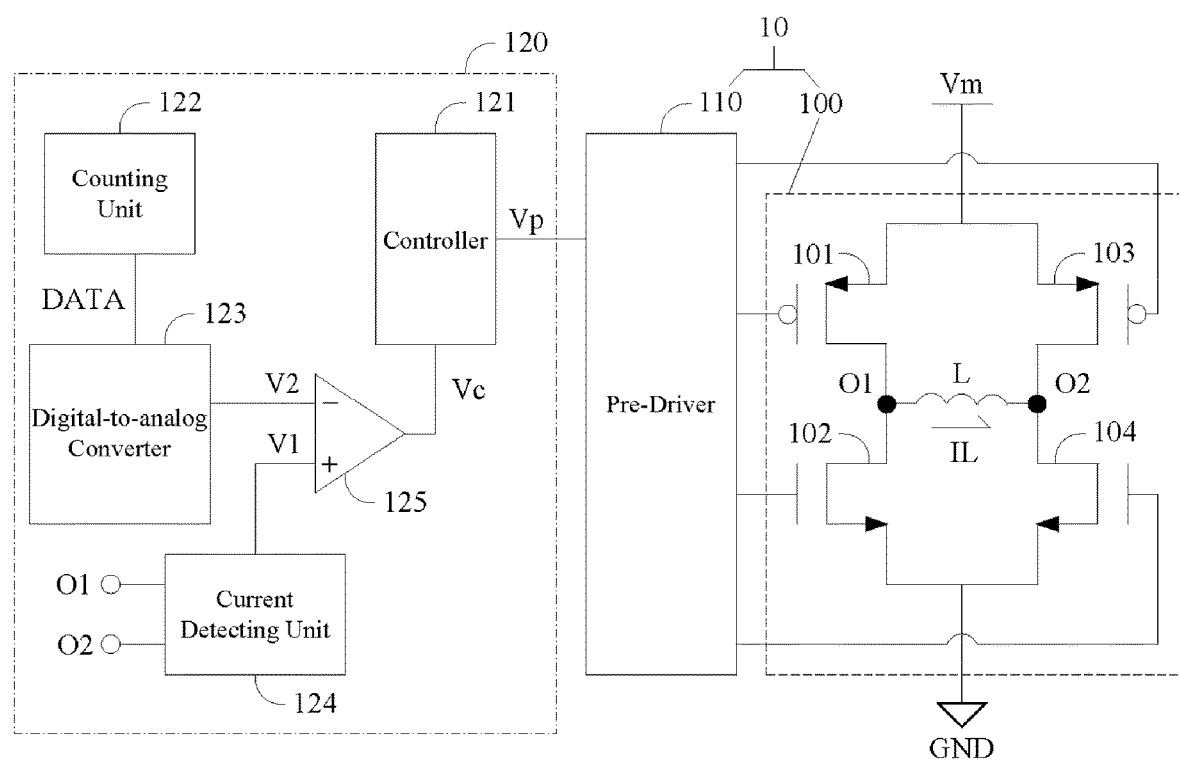
FIG. 1 is a circuit diagram showing a motor controller and a soft-start circuit according to one embodiment of the present invention.

Preferred embodiments according to the present invention will be described in detail with reference to the drawings. FIG. 1 is a circuit diagram showing a motor controller 10 and a soft-start circuit 120 according to one embodiment of the present invention. The motor controller 10 is used for driving a motor, where the motor has a motor coil L. The motor coil L has a first terminal O1 and a second terminal O2. The motor controller 10 comprises a switch circuit 100 and a pre-driver 110.

The switch circuit 100 includes a first transistor 101, a second transistor 102, a third transistor 103, and a fourth transistor 104 for supplying a driving current IL to the motor coil L. The first transistor 101 is coupled to a voltage source Vm and the first terminal O1 while the second transistor 102 is coupled to the first terminal O1 and a ground GND. The third transistor 103 is coupled to the voltage source Vm and the second terminal O2 while the fourth transistor 104 is coupled to the second terminal O2 and the ground GND. The first transistor 101, the second transistor 102, the third transistor 103, and the fourth transistor 104 may be respectively a p-type MOSFET or an n-type MOSFET. As shown in FIG. 1, each of the first transistor 101 and the third transistor 103 may be a p-type MOSFET, while each of the second transistor 102 and the fourth transistor 104 may be an n-type MOSFET. The pre-driver 110 is used to control the on/off states of the first transistor 101, the second transistor 102, the third transistor 103, and the fourth transistor 104.

The soft-start circuit 120 comprises a controller 121, a counting unit 122, a digital-to-analog converter 123, a current detecting unit 124, and a comparator 125. The current detecting unit 124 is coupled to the first terminal O1 and the second terminal O2, so as to detect the driving current IL and generate a first voltage V1 to the comparator 125. The counting unit 122 is an N-bit counter for generating an N-bit digital signal DATA to the digital-to-analog converter 123, where N≥1. N is a positive integer. For example, N may be 1, 2, 3, 4, 5, 6, 7, 8, 9, or 10. Also, N may be greater than 10. Similarly, the digital-to-analog converter 123 is an N-bit digital-to-analog converter 123 for generating a second voltage V2 to the comparator 125. The comparator 125 is configured to generate a control signal Vc to the controller 121 by comparing the first voltage V1 to the second voltage V2. The controller 121 generates a pulse width modulation signal Vp to the pre-driver 110 based on the control signal Vc, where the pulse width modulation signal Vp has a duty ratio.

Figure 2:
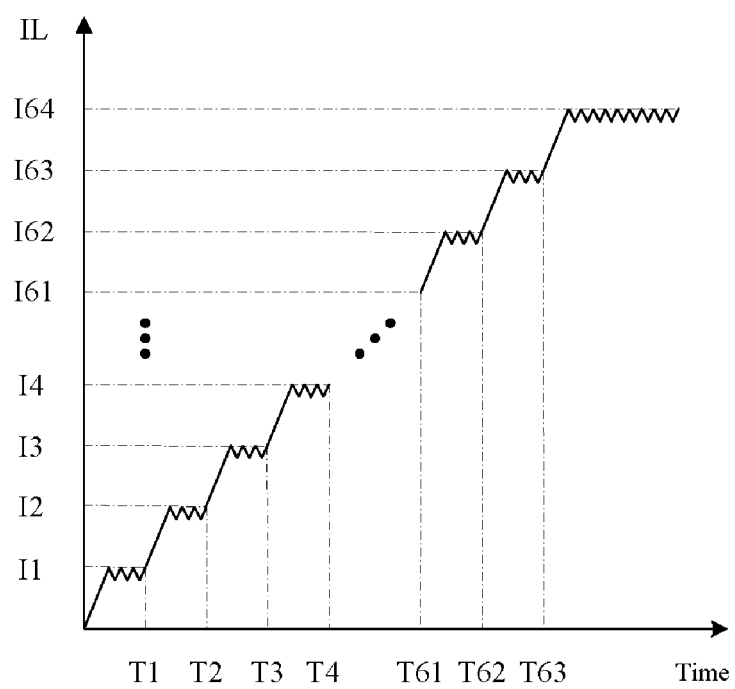
FIG. 2 is a timing chart according to one embodiment of the present invention.

FIG. 2 is a timing chart according to one embodiment of the present invention. For example, when the counting unit 122 is a 6-bit counter and the digital-to-analog converter 123 is a 6-bit digital-to-analog converter 123, it is capable of generating 63 times (T1-T63) and 64 current limit values (I1-I64) for achieving the soft-start effect. A 6-bit digital signal DATA is configured to indicate 63 times (T1-T63) respectively. The second voltage V2 has 64 voltage levels (VL1-VL64) so as to indicate 64 current limit values (I1-I64) respectively.

When the system starts to supply the power to the motor controller 10, the controller 121 increases the duty ratio gradually for driving the motor coil L. If the first voltage V1 is greater than the second voltage V2 before time T1, it reveals that the driving current IL is greater than the current limit value I1. At this moment the control signal Vc is at a high level H so as to inform the controller 121 to decrease the duty ratio. After a predetermined time the controller 121 will increase the duty ratio again. If the first voltage V1 is greater than the second voltage V2, the controller will decrease the duty ratio again. As shown in FIG. 2, the waveform of the driving current IL oscillates near the current limit value I1 with a sawtooth pattern before time T1. The second voltage V2 has a voltage level VL1 before time T1.

At time T1 the digital-to-analog converter 123 increases the second voltage V2 to indicate the current limit value I2. If the first voltage V1 is greater than the second voltage V2 during the time interval between T1 and T2, it reveals that the driving current IL is greater than the current limit value I2. At this moment the control signal Vc is at a high level H so as to inform the controller 121 to decrease the duty ratio. After the predetermined time the controller 121 will increase the duty ratio again. If the first voltage V1 is greater than the second voltage V2, the controller will decrease the duty ratio again. As shown in FIG. 2, the waveform of the driving current IL oscillates near the current limit value I2 with a sawtooth pattern during the time interval between T1 and T2. The second voltage V2 has a voltage level VL2 before time T2 and after time T1.

At time T2 the digital-to-analog converter 123 increases the second voltage V2 to indicate the current limit value I3. If the first voltage V1 is greater than the second voltage V2 during the time interval between T2 and T3, it reveals that the driving current IL is greater than the current limit value I3. At this moment the control signal Vc is at a high level H so as to inform the controller 121 to decrease the duty ratio. After the predetermined time the controller 121 will increase the duty ratio again. If the first voltage V1 is greater than the second voltage V2, the controller will decrease the duty ratio again. As shown in FIG. 2, the waveform of the driving current IL oscillates near the current limit value I3 with a sawtooth pattern during the time interval between T2 and T3. The second voltage V2 has a voltage level VL3 before time T3 and after time T2. At the same manner, the circuit operation after time T3 will not be mentioned.

Besides, the counting unit 122 of the present invention is not limited to the 6-bit counter. The digital-to-analog converter 123 of the present invention is not limited to the 6-bit digital-to-analog converter 123. Also, the number of the current limit values is not limited to 64. For example, the soft-start circuit 120 may change the duty ratio based on M current limit values, where M is greater than or equal to 3. M is a positive integer. The counting unit 122 may be a 4-bit counter and the digital-to-analog converter 123 may be a 4-bit digital-to-analog converter 123 according to another embodiment. Thus, it is capable of generating 15 times (T1-T15) and 16 current limit values (I1-I16) for achieving the soft-start effect. A 4-bit digital signal DATA is configured to indicate 15 times (T1-T15) respectively. The second voltage V2 has 16 voltage levels (VL1-VL16) to indicate 16 current limit values (I1-I16) respectively. It is capable of designing the N value based on the circuit application, so as to generate $2^N$ current limit values (I1-I2$^N$) to change the duty ratio and achieve the soft-start effect.

The soft-start circuit 120 can be applied to a single-phase or polyphase configuration. Also, the soft-start circuit 120 can be applied to an inductive actuator, such as a brushless motor, a DC motor, a voice coil motor, or an electromagnetic actuator. The soft-start circuit 120 uses a plurality of current limit values so as to achieve a maximum output power and prevent damage to the motor coil L.

While the present invention has been described by the preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A soft-start circuit which is applied to a motor controller, wherein the motor controller comprises a switch circuit and a pre-driver for supplying a driving current to a motor coil, the motor coil has a first terminal and a second terminal, and the soft-start circuit comprises:
   a current detecting unit, coupled to the switch circuit for detecting the driving current; and
   a controller, coupled to a control signal for generating a pulse width modulation signal to the pre-driver, wherein the pulse width modulation signal has a duty ratio, the soft-start circuit changes the duty ratio based on a plurality of current limit values, and the soft-start circuit prevents damage to the motor coil by generating a current based on the current limit values.

2. The soft-start circuit of claim 1, wherein the soft-start circuit changes the duty ratio based on M current limit values and M is greater than or equal to 3.

3. The soft-start circuit of claim 1, wherein the current detecting unit is coupled to the first terminal and the second terminal.

4. The soft-start circuit of claim 1, wherein the soft-start circuit further comprises a comparator and the current detecting unit generates a first voltage to the comparator.

5. The soft-start circuit of claim 4, wherein the soft-start circuit further comprises a digital-to-analog converter for generating a second voltage to the comparator.

6. The soft-start circuit of claim 5, wherein the comparator is configured to generate the control signal by comparing the first voltage to the second voltage.

7. The soft-start circuit of claim 6, wherein the soft-start circuit further comprises a counting unit for generating a digital signal to the digital-to-analog converter.

8. The soft-start circuit of claim 7, wherein the digital-to-analog converter is an N-bit digital-to-analog converter and N is equal to 4 or 6.

9. The soft-start circuit of claim 7, wherein the counting unit is an N-bit counter and N is equal to 4 or 6.

10. The soft-start circuit of claim 7, wherein the digital signal is an N-bit digital signal and N is equal to 4 or 6.

11. The soft-start circuit of claim 7, wherein the second voltage has a plurality of voltage levels.

12. The soft-start circuit of claim 7, wherein when the first voltage is greater than the second voltage, the controller decreases the duty ratio.

13. The soft-start circuit of claim 1, wherein the soft-start circuit changes the duty ratio based on a first current limit value and a second current limit value, and a waveform of the driving current oscillates near the second current limit with a sawtooth pattern.

14. The soft-start circuit of claim 1, wherein the soft-start circuit changes the duty ratio based on a first current limit value, a second current limit value, and a third current limit, and a waveform of the driving current oscillates near the third current limit with a sawtooth pattern.

15. The soft-start circuit of claim 1, wherein the soft-start circuit is applied to a single-phase or polyphase configuration.

16. The soft-start circuit of claim 1, wherein the soft-start circuit generates a maximum output power based on the current limit values.

* * * * *